United States Patent [19]
Miyabayashi

[11] Patent Number: 5,838,156
[45] Date of Patent: Nov. 17, 1998

[54] METHOD AND APPARATUS FOR AUTOMATIC PHASE CORRECTION OF NMR SPECTRA

[75] Inventor: Nobuyoshi Miyabayashi, Tokyo, Japan

[73] Assignee: Jeol Ltd., Tokyo, Japan

[21] Appl. No.: 703,572

[22] Filed: Jun. 21, 1996

[30] Foreign Application Priority Data

Jun. 23, 1995 [JP] Japan .................................. 7-157308

[51] Int. Cl.⁶ .................................................. G01R 33/46
[52] U.S. Cl. .......................................................... 324/307
[58] Field of Search .................................. 324/307, 309, 324/300, 316, 301, 303, 306, 318, 322; 128/653.2

[56] References Cited

U.S. PATENT DOCUMENTS

| | | | |
|---|---|---|---|
| 3,879,653 | 4/1975 | Hyde et al. | 324/307 |
| 4,727,324 | 2/1988 | Bendall et al. | 324/309 |
| 4,742,303 | 5/1988 | Bendall | 324/309 |
| 4,896,113 | 1/1990 | Pelc | 324/309 |
| 5,457,385 | 10/1995 | Sydney et al. | 324/301 |

OTHER PUBLICATIONS

Phase Correction of Two–Dimensional NMR Spectra Using DISPA, R.E. Hoffman et al., *Journal of Magnetic Resonance*, 98, pp. 231–237 (1992).

"Novel Methods for Automatic Phase Correction of NMR Spectra", J.J. van Vaals et al., *Journal of Magnetic Resonance*, 86, pp. 127–147 (1990).

"Automated Phase Correction of FT NMR Spectra by Means of Phase Measurement Based on Dispersion versus Absorption Relation (DISPA)", Edward C. Craig et al., *Journal of Magnetic Resonance*, 76, pp. 458–475 (1988).

*Primary Examiner*—Sandra L. O'Shea
*Assistant Examiner*—Roger C. Phillips
*Attorney, Agent, or Firm*—Webb Ziesenheim Bruening Logsdon Orkin & Hanson, P.C.

[57] ABSTRACT

An apparatus for automatically correcting phase shifts in a nuclear magnetic resonance (NMR) spectrum. The apparatus comprises first and second phase correction means. The first phase correction means corrects phase shifts due to measurement delay, phase shifts due to a frequency filter, and phase shifts due to off-resonance effects. The second phase correction means corrects constant terms of the phase shifts. Where the spectrum is a multi-dimensional NMR spectrum, the first phase correction means corrects the phase shifts on the directly observed axis. The first phase correction means corrects the phase shifts due to the measurement delay and the phase shifts due to the off-resonance effects on the indirectly observed axis. The second phase correction means corrects the phase shifts only on the directly observed axis. This construction permits automatic corrections of the phase shifts without relying on spectroscopist's eye, individual intuition or experience.

13 Claims, 13 Drawing Sheets

¹H SPECTRA OF 20mg STRYCHNINE IN 0.5ml CDCl₃
MEASURED BY JNM-A400

$^{13}C$ SPECTRA OF 20mg STRYCHNINE IN 0.5ml $CDCl_3$ MEASURED BY JNM-A400

DEPT SPECTRA OF 20mg STRYCHNINE IN 0.5ml CDCl$_3$
MEASURED BY JNM-A400

DQF-COSY SPECTRA OF 20mg STRYCHNINE IN 0.5ml CDCl$_3$ MEASURED BY JNM-A500

NOESY SPECTRA OF 20mg STRYCHNINE IN 0.5ml CDCl₃
MEASURED BY JNM-A500

HSQC SPECTRA OF 20mg STRYCHNINE IN 0.5ml CDCl$_3$
MEASURED BY JNM-A500

METHOD AND APPARATUS FOR AUTOMATIC PHASE CORRECTION OF NMR SPECTRA

FIELD OF THE INVENTION

The present invention relates to a method and apparatus for automatically correcting phase shifts contained in NMR (nuclear magnetic resonance) spectra.

In a nuclear magnetic resonance (NMR) spectrometer, a specimen to be investigated is placed in a static magnetic field. An RF magnetic field having a resonance frequency is applied in the form of pulses to the specimen via a transmitter/receiver coil located around the specimen. A resonance signal induced in the transmitter/receiver coil is extracted as a free induction decay (FID) signal. This FID signal is subjected to Fourier transformation. As a result, an NMR spectrum is obtained. A one-dimensional (1D) NMR spectrum is represented as a chart in which the absorption intensity is plotted on the vertical axis, while the frequency or magnetic field strength is plotted on the horizontal axis.

A multi-dimensional NMR measurement such as a two-dimensional NMR measurement is conducted by applying two pulses to the specimen at an interval of time, known as evolution period $t_1$, as shown in FIG. 1. The resulting FID signal is detected during a detection period $t_2$ and stored in a memory. This measurement is repeated a given number of times M while varying the evolution period $t_1$ in increments. As a result of a series of measurements, M free induction decay (FID) signals are derived. As shown in FIG. 2, data sets A ($t_2$, $t_1$) represent these M FID signals. A two-dimensional NMR spectrum data S ($F_2$, $F_1$) is obtained by double-Fourier transforming the data sets A ($t_2$, $t_1$) with respect to $t_2$ and $t_1$.

In FIG. 2, the $F_2$-axis of the two-dimensional NMR spectrum is obtained by Fourier transforming the $t_2$-axis and known as a directly observed axis. The $F_1$-axis is obtained by Fourier transforming the $t_1$-axis and known as an indirectly observed axis.

NMR measurements are carried out as described above. It is inevitable that phase shifts are introduced to the obtained NMR spectrum due to various factors. These phase shifts exist on every observed axis of multi-dimensional NMR spectra, as well as on an observed axis of one-dimensional NMR spectra. In order to obtain a complete absorption-mode spectrum which can be used for spectrum analysis, it is necessary to correct the phase shifts on every observed axis. This correcting operation has been heretofore conducted in the manner described below. A spectroscopist gives corrective coefficients (zeroth-order and first-order terms) while watching the spectrum. The corrective coefficients are judged from the signal shape in the case of a one-dimensional NMR spectrum. Then data is processed using the coefficients. Thus, the phase shifts are corrected.

However, it is not easy for the human analyzer to determine the coefficients while watching the spectrum with his eyes for phase corrections. For these phase corrections, individual intuition, knowledge and experience are necessary. Therefore, the result may vary among individual human analyzers. Furthermore, with corrections based on zeroth-order and first-order terms, it is impossible to enhance the accuracy of the corrections. Accordingly, a technique for correcting phase shifts in multi-dimensional NMR spectra with computer software without human intervention has been long sought for.

SUMMARY OF THE INVENTION

The present invention is intended to solve the foregoing problem. It is an object of the invention to provide an apparatus capable of automatically correcting phase shift in NMR spectra.

It is another object of the invention to provide a method of automatically correcting phase shifts in NMR spectra.

A method of automatically correcting phase shifts contained in a nuclear magnetic resonance (NMR) spectrum in accordance with the present invention comprises the steps of: obtaining data $S(\omega)$ about an NMR spectrum of a specimen, by nuclear magnetic resonance measurements, wherein frequency $\omega$ is a variable; correcting said data $S(\omega)$ about phase shifts $\phi_d$ due to delay of the measurements, phase shifts $\phi_f$ due to a frequency filter, and phase shifts $\phi_o$ due to off-resonance effects; and correcting the corrected data about phase shifts $\phi_c$ due to a phase difference between an RF carrier and a reference used in said NMR measurements.

An apparatus for automatically correcting phase shifts contained in a nuclear magnetic resonance (NMR) spectrum in accordance with the present invention comprises: means for making nuclear magnetic resonance measurements, using an RF carrier wave and a detected reference wave, to obtain data $S(\omega)$ about an NMR spectrum of a specimen, said NMR spectrum containing a frequency $\omega$ as a variable; a first phase correction means for correcting said data $S(\omega)$ for phase shifts $\phi_d$ due to delay of the measurements, phase shifts $\phi_f$ due to a frequency filter, and phase shifts $\phi_o$ due to off-resonance effects; and a second phase correction means for correcting the corrected data for phase shifts $\phi_c$ due to a phase difference between said RF carrier wave and said detected reference wave.

Before describing the preferred embodiments of the invention, phase shifts are described in detail. First, a free induction decay (FID) signal and an NMR spectrum are defined in terms of mathematical formulas. An FID signal $F(t)$ has a phase shift at instant of time $t=0$ and is observed as the sum of exponentially decaying signals (waves). This FID signal is given by $$F(t) = \sum_{j=1}^{N} I_j \exp(-t/\tau_j)\exp\{i(\omega_j t + \phi_j)\} \quad (1)$$

where N is the number of the signals, $I_j$ is the intensity of a signal j at the instant $t=0$, $\tau_j$ is the relaxation constant of the signal j, $\omega_j$ is the angular frequency of the signal j, and $\phi_j$ is the phase shift of the signal j at the instant $t=0$.

The FID signal is allowed to decay completely. Under this measurement condition, the FID signal is Fourier transformed, thus obtaining a spectrum $S(\omega)$ given by $$S(\omega) = \sum_{j=1}^{N} I_j \left\{ \frac{\tau_j + i\tau_j^2(\omega_j - \omega)}{1 + \tau_j^2(\omega_j - \omega)^2} \right\} \exp(i\phi_j) \quad (2)$$

In the above equation, the portion $I_j\{\ \}$ is spectral components of the signal j having no phase shifts. $\phi_j$ is the phase shift of the signal j. Since it can be assumed that the phase shift is a function of frequency, the spectrum is eventually given by $$S(\omega) = \sum_{j=1}^{N} I_j \left\{ \frac{\tau_j + i\tau_j^2(\omega_j - \omega)}{1 + \tau_j^2(\omega_j - \omega)^2} \right\} \exp\{i\phi(\omega)\} \quad (3)$$

$$= S'(\omega) \times \exp\{i\phi(\omega)\}$$

where $S'(\omega)$ is a true spectrum having no phase shift. The remaining portion $\exp\{i\phi(\omega)\}$ is the phase-shift component.

A one-dimensional NMR spectrum has been discussed thus far. A phase shift in a multi-dimensional NMR spectrum is given by $$\prod_n \exp\{i_n \phi(\omega_n)\} \quad (4)$$

where N is the number of dimensions, $i_n$ is an imaginary number assigned to some axis, and $\omega_n$ is the frequency on some axis.

For example, in the case of a two-dimensional NMR, phase shifts $\phi_{F2}(\omega)$ and $\phi_{F1}(\omega)$ on the directly observed axis $F_2$ and on the indirectly observed axis $F_1$, respectively, can be generally expressed in polynomials given by $$\phi_{F2}(\omega) = P0_{F2} + P1_{F2} \cdot \omega + P2_{F2} \cdot \omega^2 + \ldots \quad (5)$$

$$\phi_{F1}(\omega) = P0_{F1} + P1_{F1} \cdot \omega + P2_{F1} \cdot \omega^2 + \ldots$$

where P0, P1, P2, ... are the coefficients of the zeroth order, first order, second order, and so on, and $\omega$ is an angular frequency. If the coefficients in the above equations are determined, the phase shifts can be canceled out by making corrections to the data about the NMR spectrum by means of calculations.

We have discussed the factors of phase shifts contained in the NMR spectrum and have found that major causes of the phase shifts are the following four factors:

The first factor is a delay of the beginning of measurement of the FID signal. In NMR measurement, the FID signal is not detected until the application of a pulse sequence ends and the distortion of the tails of the pulse becomes so small that they can be neglected compared with the intensity of the FID signal, as illustrated in FIG. 1.

The second factor is a frequency filter inserted in the detection circuit. This filter has phase characteristics, and whole frequency components contained in the FID signal are affected by the phase characteristics.

The third factor is off-resonance effects in the pulse duration. When an exciting pulse is being applied, an effective RF magnetic field tilted in a rotating frame acts on nuclear spins which are not just at resonance, i.e., at off-resonance. As a result, signal components from nuclear spins not just at resonance contain phase shifts. A just-resonance condition occurs with only nuclear spins having the same precessional frequency as the frequency of the carrier of pulses.

The fourth factor is the difference in phase between the carrier of RF pulses and the reference signal when the FID signal is detected.

The phase shifts due to these four factors do not occur equally for both axes $F_2$ and $F_1$ in the case of, for example, two-dimensional NMR spectroscopy. In particular, phase shifts on the $F_2$-axis are caused by the four factors: measurement delay, frequency filter, off-resonance effects, and phase difference between the carrier and the reference signal. On the other hand, phase shifts on the $F_1$-axis are caused by two factors: measurement delay and off-resonance effects.

TABLE 1

| factor | $F_2$-axis | $F_1$-axis |
|---|---|---|
| measurement delay | o | o |
| frequency filter | o | |
| off-resonance effects | o | o |
| phase difference | o | |

Of these factors, the measurement delay, frequency filter, and off-resonance effects produce only higher-order phase shifts which are functions of the frequency on the observed axis. The phase difference between the carrier wave and the reference wave produces a zeroth-order phase shift which does not depend on the frequency. Taking account of these facts, Eq. (5) can be replaced by $$\phi_{F2}(\omega_{F2}) = \phi_{dF2}(\omega_{F2}) + \phi_{fF2}(\omega_{F2}) + \phi_{oF2}(\omega_{F2}) + \phi_{cF2} \quad (6)$$

$$\phi_{F1}(\omega_{F1}) = \phi_{dF1}(\omega_{F1}) + \phi_{oF1}(\omega_{cF1})$$

In Eq. (6) above, $\phi_d$, $\phi_f$, $\phi_o$ and $\phi_c$ represent phase shifts cause by delay of measurements, filter, off-resonance effects, and the phase difference between the carrier and the reference signal, respectively. The present invention is characterized in that the phase shifts due to these four factors are classified, depending on the type of the axis, i.e., directly observed axis and indirectly observed axis, for achieving appropriate corrections.

Other objects and features of the invention will appear in the course of the description thereof, which follows.

DETAILED DESCRIPTION OF THE INVENTION

Figure 3:
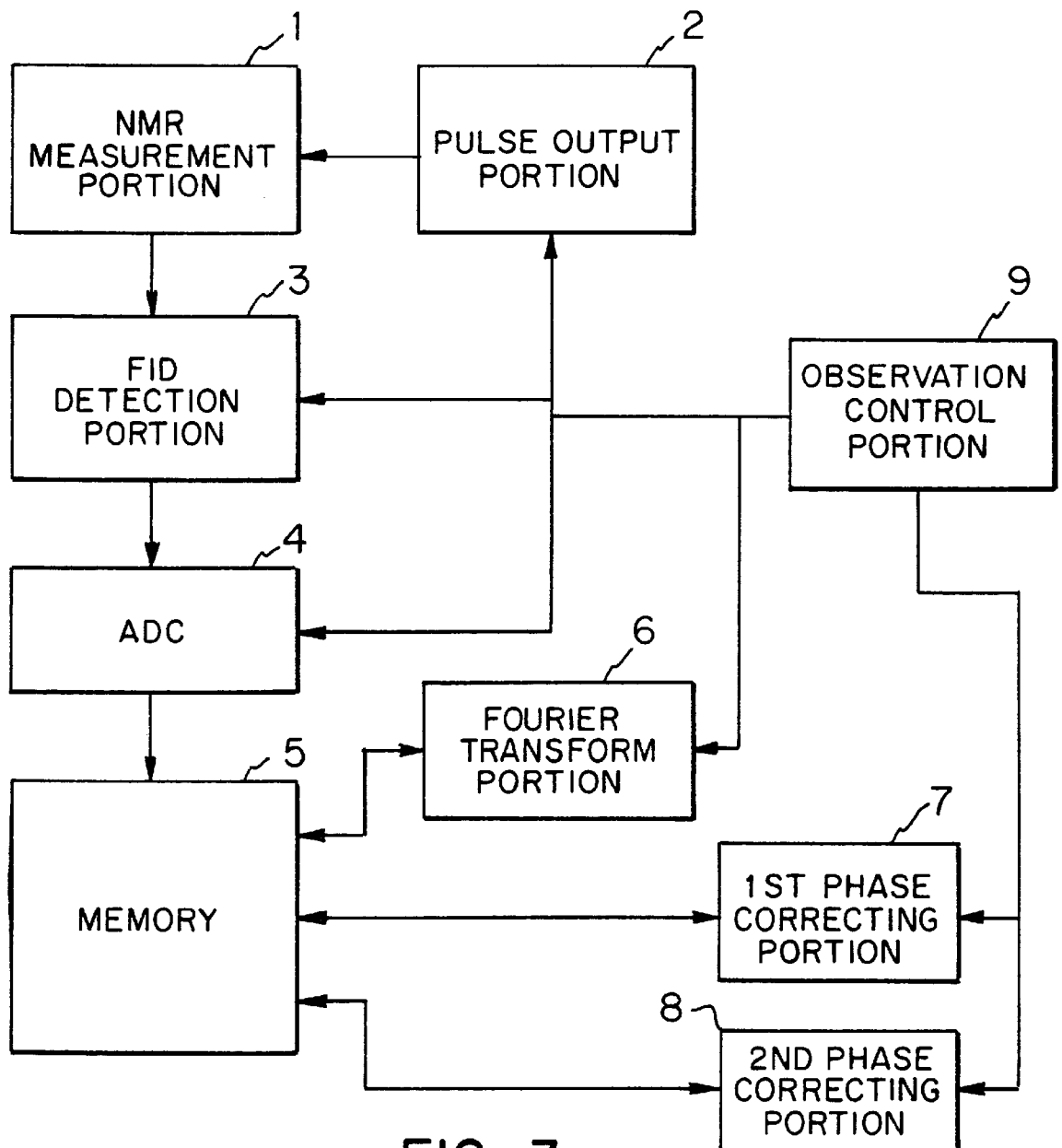
FIG. 3 is a block diagram of an apparatus for automatically correcting phases in an NMR spectrum, the apparatus being built according to the present invention.

Referring to FIG. 3, there is shown an apparatus embodying the concept of the invention, the apparatus being designed to automatically correct phases in NMR spectra. The apparatus has an NMR measurement portion 1 comprising a magnet for producing a static magnetic field together with an NMR probe. A specimen and a transmitter/receiver coil disposed around the specimen are held in the NMR probe. A pulse output portion 2 applies a given pulse sequence to the specimen via the transmitter/receiver coil. As a result, a free induction decay (FID) signal is induced in the coil assembly. The induced signal is detected by an FID detection portion 3 equipped with a frequency filter. The output signal from the FID detection portion 3 is sent via an A/D converter 4 to a memory 5, where the signal is stored. A Fourier-transform portion 6 Fourier transforms the FID signal stored in the memory 5, thus obtaining data about an NMR spectrum. The obtained data is stored in the memory 5.

The apparatus further includes a first phase-correcting portion 7 and a second phase-correcting portion 8. The first phase-correcting portion 7 corrects phase shifts in the data about the NMR spectrum stored in the memory 5 on the directly observed axis and on the indirectly observed axis, the phase shifts being due to measurement delay introduced when the FID signal is detected. Furthermore, the first phase-correcting portion 7 corrects phase shifts due to the frequency filter on the directly observed axis. In addition, the first phase-correcting portion 7 corrects phase shifts due to off-resonance effects on the directly observed axis and on the indirectly observed axis. The second phase-correcting portion 8 finds phase shifts due to the phase difference between a reference detected wave and a carrier wave on the directly observed axis, and then makes corrections. An observation control portion 9 controls the pulse output portion 2, the FID detection portion 3, the A/D converter 4, the Fourier-transform portion 6, the first phase-correcting portion 7, and the second phase-correcting portion 8. The observation control portion 9 sends various kinds of information used for phase corrections to the first phase-correcting portion 7. These various kinds of information include information about the pulse sequence used for the measurement, information about the pulse width and observed frequency width, information about measurement delay of the FID detection portion 3, and the kind and frequency characteristics of the frequency filter of the FID detection portion 3.

Figure 1:
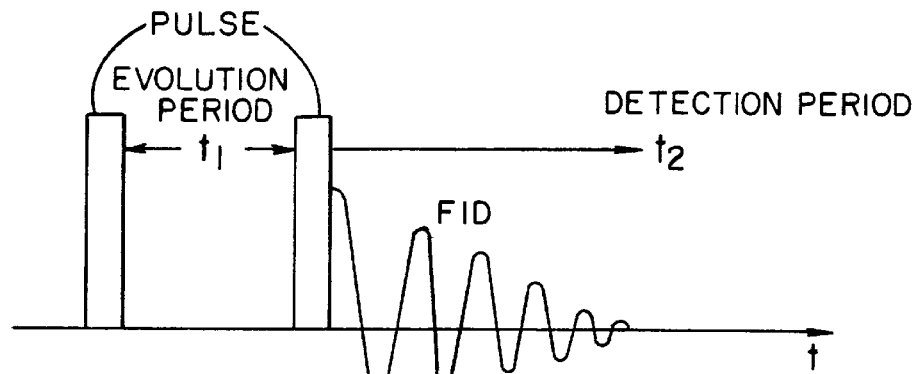
FIG. 1 is a waveform diagram showing a pulse sequence used in two-dimensional (2D) NMR measurement and a resulting FID signal.
Figure 4:
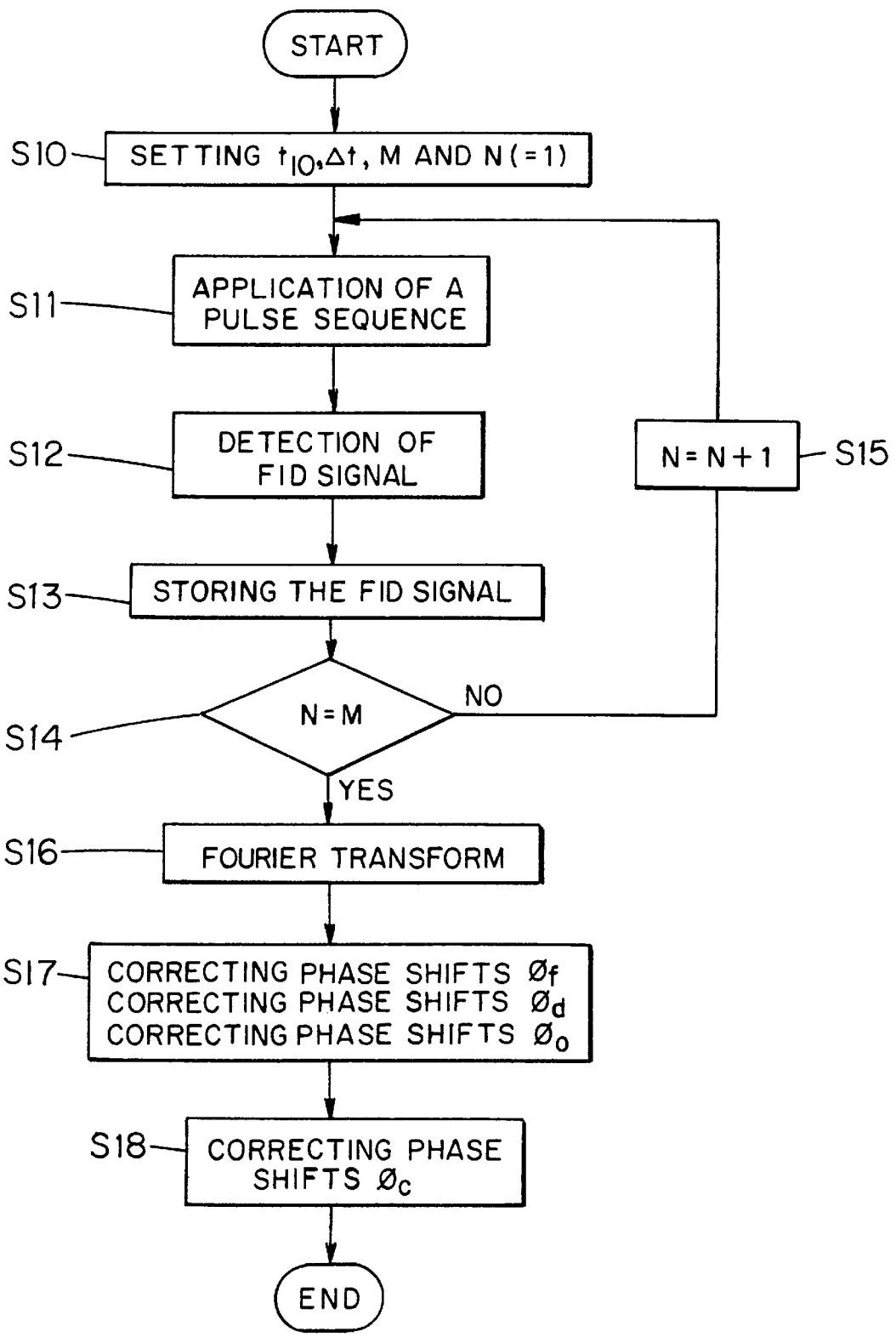
FIG. 4 is a flowchart illustrating the operation of an NMR spectrometer incorporating the phase-correcting apparatus shown in FIG. 3.

An example of procedure for operating the apparatus to make two-dimensional NMR measurements is next described by referring to the flowchart of FIG. 4. In step 10, a spectroscopist sets the initial value $t_{10}$ of the evolution period $t_1$, an increment $\Delta t$ of the evolution period $t_1$, and the number of measurements M. The present number of measurements N is set to 1. In the next step 11, the pulse sequence generated by the pulse output portion 2 is applied to the specimen via the transmitter/receiver coil assembly of the NMR measurement portion 1. The pulse sequence consists of two pulses which are produced at an interval of $t_1$ (=$t_{10}$+N·$\Delta t$), as shown in FIG. 1. In the next step 12, a free induction decay signal FID1 induced in the transmitter/receiver coil in response to resonance of the observed nuclei in the specimen is detected by the detection portion 3 with respect to the directly observed axis (time axis) $t_2$. Then, in step 13, the obtained FID signal is converted into digital form by the A/D converter 4 and stored in the NMR data storage portion 5 that is a computer memory. In step 14, a decision is made as to whether the present number of measurements N is equal to the number of measurements M. If they do not agree, the number N is increased by 1 (N=N+1) (step 15). Subsequently, control returns to step 11.

Figure 2:
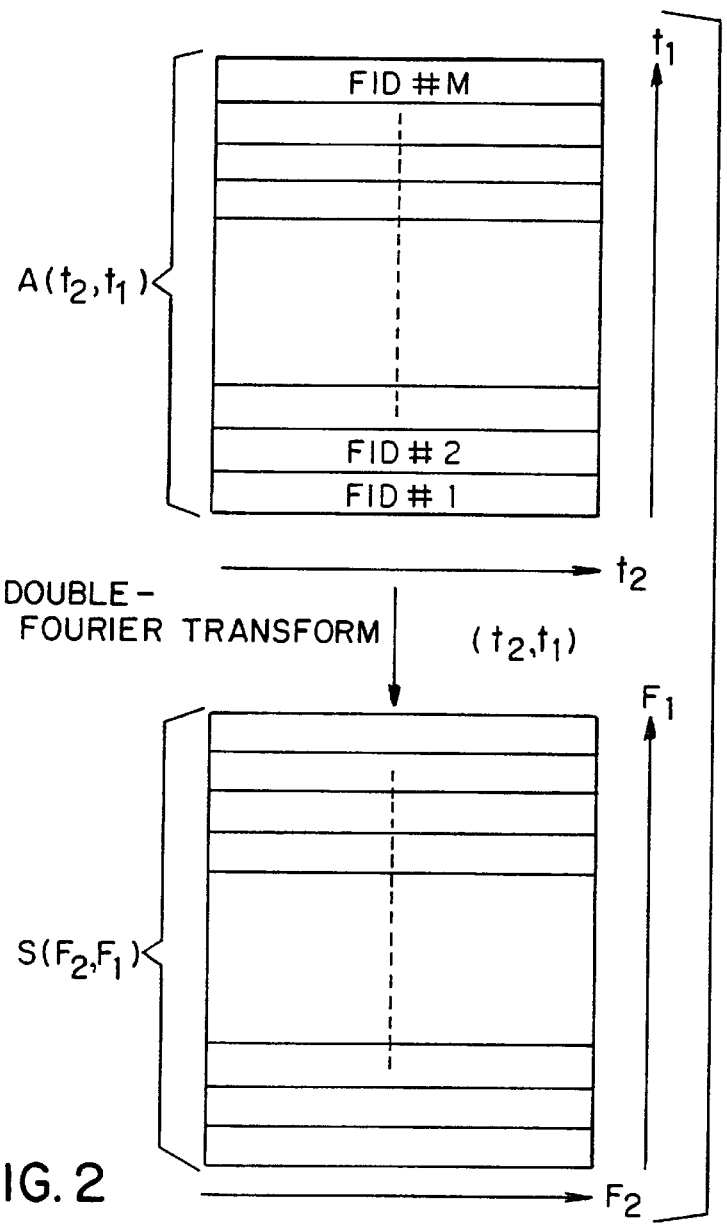
FIG. 2 is a diagram illustrating a calculational process for finding a 2D NMR spectrum.

The above-described steps 11–13 are repeated M times while varying the evolution period $t_1$ in increments until the equality N=M is attained. When the relation N=M holds and M measurements end, data sets A ($t_2$, $t_1$) are stored in the storage portion 5. The data sets A ($t_2$, $t_1$) represent the M FID signals arranged in the order $t_1$, as shown in FIG. 2.

After completion of the M measurements, the data sets A ($t_2$, $t_1$) stored in the storage portion 5 is double-Fourier transformed with respect to $t_2$, $t_1$ by the Fourier-transform portion 6. As a result, data about the two-dimensional spectrum S($F_2$, $F_1$) is obtained (step 16).

The first correcting portion 7 makes phase corrections to the obtained data about the two-dimensional spectrum S($F_2$, $F_1$) (step 17). Then, the second correcting portion 8 makes phase corrections to the data (step 18). As a result, a pure absorption spectrum is obtained. The step 17 comprises a step 17-1 for correcting phase shifts $\phi_f$ introduced by the frequency filter, a step 17-2 for correcting phase shifts $\phi_d$ due to measurement delay, and a step 17-3 for correcting phase shifts $\phi_o$ due to off-resonance effects. In the step 18, phase shifts $\phi_c$ due to the phase difference between the detected reference wave and the carrier wave are corrected. The corrections of the phase shifts $\phi_f$, $\phi_d$ and $\phi_c$ made by the first correcting portion 7 and the corrections of the phase shifts $\phi_c$ made by the second correcting portion 8 are next described in detail.

[17-1] Correction of Phase Shifts $\phi_f$ due to Frequency Filter

The frequency filter is designed, based on a calculational formula in a frequency space. The calculational formula has been previously stored in the phase-correcting portion 7. As an example, in the case of a quadrupole Butterworth filter which is an analog frequency filter, the calculation formula is given by $$T_f(\omega) = \prod_{k=1}^{2} \frac{Q_k^2}{(i\omega/\omega_c)^2 + (\Omega_k/Q_k)(i\omega/\omega_c) + \Omega_k^2} \qquad (7)$$

where $\Omega_k$ and $Q_k$ are design constants of the filter, and $\omega_c$ is the cutoff frequency. In the quadrature phase detection method normally utilized in modern NMR instruments, only the angular frequency components lying in the range $-\omega_c$ to $\omega_c$ are passed.

$T_f(\omega)$ included in Eq. (7) is a frequency filter function and has an intensity characteristic given by $|T_f(\omega)|$ and a phase characteristic given by $T_f(\omega)/|T_f(\omega)|$.

The following relation holds between the true spectrum S'($\omega$) and the spectrum S($\omega$) passed through the filter $$S(\omega) = T_f(\omega) \times S'(\omega) \quad (8)$$
$$= \{T_f(\omega)/|T_f(\omega)|\} \times |T_f(\omega)| \times S'(\omega)$$

Since the term included in the braces { } cause a phase shift, comparison with Eq. (2) results in $$\exp\{i\,\phi_f(\omega)\} = T_f(\omega)/|T_f(\omega)| \quad (9)$$

Because $T_f(\omega)$ included in Eq. (9) can be computed from Eq. (6), the phase shift of the frequency filter at an arbitrary frequency can be numerically found from Eq. (9). In order to correct the phase shift $\phi_f(\omega)$, it is necessary to rotate the spectral value $S(\omega)$ at the angular frequency $\omega$ through an angle $-\phi_f(\omega)$. Therefore, a spectrum $S_1(\omega)$ in which the phase shift $\phi_f(\omega)$ has been corrected can be obtained from the following equation $$S_1(\omega) = S(\omega)[\cos\{-\phi_f(\omega)\} + i\sin\{-\phi_f(\omega)\}] \quad (10)$$
$$= S(\omega)[\cos\{\phi_f(\omega)\} - i\sin\{\phi_f(\omega)\}]$$

In brief, in the step 17-1, the phase shift $\phi_f$ at an arbitrary angular frequency is simulated from the calculational formula (6) for the filter design and from Eq. (9) within the observed frequency range on the directly observed axis $F_2$. Using found phase shift $\phi_f$, the spectrum $S(\omega)$ obtained by a measurement is corrected, based on Eq. (10).

A digital filter can be used as the aforementioned frequency filter in conjunction with an analog filter. Alternatively, a digital filter is used alone, in which case the phase shift can be simulated from the calculational formula of the digital filter in exactly the same way as the foregoing, and the spectrum $S(\omega)$ can be corrected, using the found phase shift $\phi_f$. Where both filters are used together, a composite phase shift is synthesized, based on their respective calculational formulas. In this way, the composite phase shift is simulated.

[17-2] Correction of Phase Shifts $\phi_d$ due to Measurement Delay

As mentioned above, a delay time is necessary in the interval between the origin of time of the FID signal and the beginning of detection. Let $t_d$ be this time interval. If this time interval is reflected in Eq. (1), then we have $$F(t) = \sum_{j=1}^{N} I_j \exp\{-(t+t_d)/\tau_j\}\exp\{i\omega_j(t+t_d)\} \quad (11)$$

Fourier transforming this equation results in a spectrum given by $$S(\omega) = \sum_{j=1}^{N} I_j \left\{ \frac{\tau_j + i\tau_j^2(\omega_j - \omega)}{1 + \tau_j^2(\omega_j - \omega)^2} \right\} \times \exp(-t_d/\tau_j)\exp(i\omega_j t_d) \quad (12)$$

In Eq. (12) above, $\omega_j t_d$ are the phase shifts introduced by delay of measurement of signal j. Eq. (12) demonstrates that the phase shifts introduced by the measurement delay depend on the angular frequencies of individual signals. In order to completely correct the phase shifts, the phase shifts must be corrected independently after separated into individual signals. For this separation, an iterative method such as the least squares method is necessary. Hence, a long computation time is required. Fortunately, an NMR signal is sharp and so it is assumed that no problem will arise if a replacement $\omega = \omega_j$ is done. On this assumption, phase shifts $\phi_d(\omega)$ can be given by $$\phi_d(\omega) = \omega t_d \quad (13)$$

Since $t_d$ is known and referred to as a measurement condition, the phase shifts $\phi_d(\omega)$ can be found numerically. In practice, the phase shifts $\phi_d(\omega)$ are found on both axes $F_2$ and $F_1$. Corrections are made on both axes. With respect to the $F_2$-axis, the actual measurement delay time can be used as the measurement condition $t_d$ in finding the phase shifts $\phi_d(\omega)$. With respect to the $F_1$-axis, the initial value of the evolution time $t_1$ can be used as the measurement condition $t_d$.

In order to correct the phase shifts $\phi_d(\omega)$ on the found $F_2$- and $F_1$-axes, it is necessary to rotate the spectrum $S_1(\omega)$ further through $-\phi_d(\omega)$ the spectrum $S_1(\omega)$ having been corrected for phase shifts due to the phase filter. Accordingly, a spectrum $S_2(\omega)$ corrected for phase shifts $\phi_d(\omega)$ can be obtained by performing a calculation given by $$S_2(\omega) = S_1(\omega)\{\cos(\omega t_d) - i\sin(\omega t_d)\} \quad (14)$$

In summary, in the step 17-2, the phase shifts $\phi_d$ are found from Eq. (13) over the whole range of observed frequencies, using information given by the spectroscopist about the measurement delay time. For example, with respect to the $F_2$-axis, the information is about the delay time. With respect to the $F_1$-axis, the information is about the initial value of the evolution time $t_1$. The spectrum is corrected, based on Eq. (14), using the found phase shifts $\phi_d$.

[17-3] Correction of Phase Shifts $\phi_o(\omega)$ due to Off-Resonance Effects As described previously, when exciting pulses are being applied, nuclear spins which are not just at resonance, i.e., at off-resonance, undergo effective RF magnetic fields which are tilted in a rotating frame. When an RF pulse having a duration of $\tau_p$ is applied, those nuclear spins which are not just at resonance are caused to precess by the tilted effective magnetic fields. Consequently, the nuclear spins not just at resonance have phase shifts $\phi_o(\omega)$ dependent on the offset frequency $\Omega$. This offset frequency $\Omega$ is a frequency used in NMR spectroscopy and has a relation given by the following formula to the angular frequency $$\Omega = -\{\omega/2\pi\} \times F_{req}$$

where $F_{req}$ is the observed frequency range. Phase shifts due to the off-resonance effects have relationships given by $$\sin\{\phi_o(\omega)\} = \frac{(1-\cos\beta)\cos\theta}{\sqrt{\sin^2\beta + (1-\cos\beta)^2\cos^2\theta}} \quad (15)$$

$$\cos\{\phi_o(\omega)\} = \frac{\sin\beta}{\sqrt{\sin^2\beta + (1-\cos\beta)^2\cos^2\theta}} \quad (16)$$

In the above equations, the following relation exists $$\cos\theta + \frac{1 - 4\Omega\tau_{90}}{\sqrt{1 + (4\Omega\tau_{90})^2}} \quad (17)$$

$$\sin\beta = \sin\{\tau_p \sqrt{(4\tau_{90})^{-2} + \Omega^2}\,\}$$

$$\cos\beta = \cos\{\tau_p \sqrt{(4\tau_{90})^{-2} + \Omega^2}\,\}$$

In Eqs. (15), (16), and (17), the width $\tau_{90}$ of the 90°-pulse and the width $\tau_p$ of the effective pulse are known constants. Therefore, the phase shifts $\phi_o(\omega)$ are functions of the angular frequency. In order to correct the phase shifts $\phi_o(\omega)$ due to the off-resonance effects, it is necessary to rotate the spectrum $S_2(\omega)$ further through $-\phi_o(\omega)$ after the spectrum has been corrected for the phase shifts due to the measurement delay. Therefore, a calculation given by the following equation is performed $$S_3(\omega)=S_2(\omega)[\cos\{\phi_o(\omega)\}-i\sin\{\phi_o(\omega)\}] \quad (18)$$

In this way, the spectrum $S_3(\omega)$ which has been corrected for the phase shifts $\phi_o(\omega)$ due to the off-resonance effects can be found.

In performing the calculation of Eq. (18), $\cos\{\phi_o(\omega)\}$ and $\sin\{\phi_o(\omega)\}$ calculated in Eqs. (15) and (16) can be employed without finding the phase shifts $\phi_o(\omega)$ Accordingly, in the step 17-3, the phase shifts $\phi_o(\omega)$ are found over the whole range of the observed frequencies on the $F_2$- and $F_1$-axes from Eqs. (15), (16), and (17), based on the information (such as information about the pulse widths) about the pulse sequence used for the measurements. The information is given from the spectroscopist. The spectrum is corrected, based on Eq. (18), using the found phase shifts $\phi_o$.

[18] Correction of Phase Shifts $\phi_c(\omega)$ due to Phase Difference between Carrier and Reference The spectrum $S_3(\omega)$ has been corrected for the phase shifts $\phi_p$, $\phi_d$, and $\phi_o$ by the corrections by the above-described steps [17-1], [17-2], and [17-3]. Only the phase shifts $\phi_c$ common to all frequencies in the whole range remain on the spectrum $S_3(\omega)$ with respect to the directly observed $F_2$-axis.

Figure 5A:
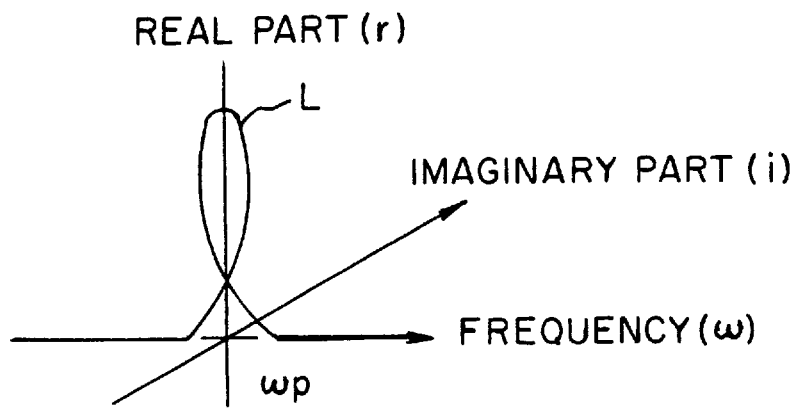
FIGS. 5(a)–5(e) are diagrams illustrating phase shifts in NMR spectra.
Figure 5B:
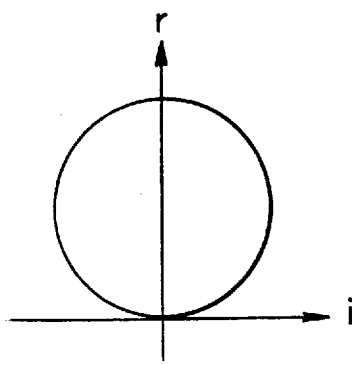

FIG. 5(a) conceptually illustrates the orbit of a spectral intensity near one signal peak of an NMR spectrum. The orbit is represented as a three-dimensional curve L on a frequency-complex space (r, i, $\omega$). Since magnetization induces no resonance at frequencies remote from the peak position $\omega_p$, the curve L is on the $\omega$-axis, as shown in FIG. 5(a). When the peak position $\omega_p$ is crossed, magnetization induces a resonance. As a result, the curve L makes one revolution on the i-r plane passing through the point $\omega=\omega_p$. Therefore, if the curve L is projected onto the i-r plane (complex plane), a circle is drawn, as shown in FIG. 5(b). If the curve L is projected onto the $\omega$-r plane, a normal spectrum in which frequencies w are plotted on the vertical axis is obtained. The spectrum assumes a pure absorption waveform, as shown in FIG. 5(d).

Figure 5C:
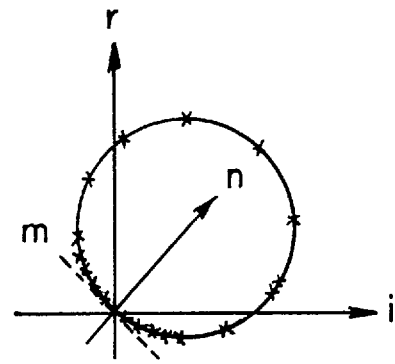
Figure 5D:
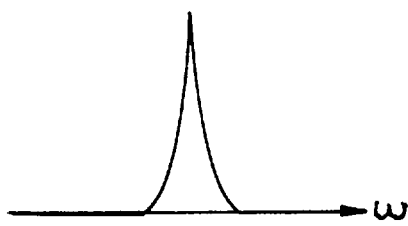
Figure 5E:
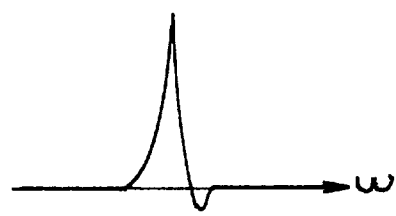

At this time, if a phase difference exists between the detected reference wave and the carrier wave, then the circle obtained by projecting the curve L rotates about the t-axis through the angle $\phi_c$ corresponding to the phase difference, as shown in FIG. 5(c). If the circle is then projected onto the $\omega$-r plane, a peak waveform distorted by phase shifts is created, as shown in FIG. 5(e).

If the angle $\phi_c$ through which the circle is rotated as shown in FIG. 5(c) is found, a spectrum $S_4(\omega)$ corrected for the phase shifts can be derived by the following calculational processing for rotating the whole spectrum through the angle $\phi_c$ in the reverse direction $$S_4(\omega)=S_3(\omega)\{\cos(\phi_c)-i\sin(\phi_c)\} \quad (19)$$

This angle $\phi_c$ can be found by selecting only data existing in the vicinities of a region which surrounds the broken line in FIG. 5(c) and contains the origin (i=0, r=0) from discrete data forming the circle of FIG. 5(c), investigating the direction of dispersion of the selected data, and determining the tilt of the tangent m to the circle at the origin. Data about the NMR spectrum obtained by measurements is composed of a large number of data points which are regularly spaced from each other by a given frequency increment. The data contained in the aforementioned region close to the origin is not associated with the peak of the spectrum but related to those portions of the spectrum which have no peak and also to foot portions.

Figure 6:
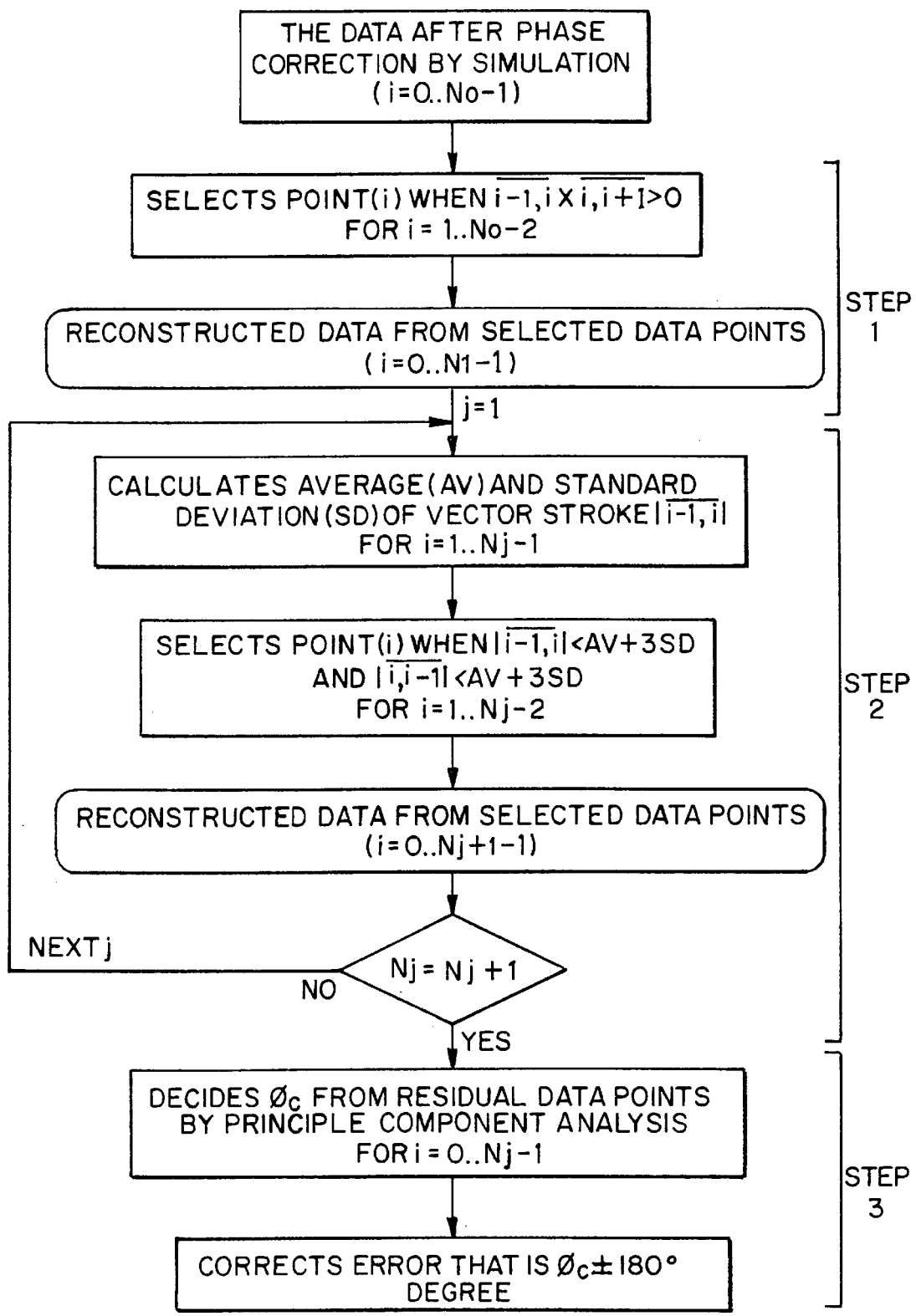
FIG. 6 is a flowchart illustrating one example of procedure for correcting phase shifts $\phi_c$.

FIG. 6 is a flowchart illustrating the procedure for carrying out corrections based on the concept described above. In FIG. 6, steps 1 and 2 are carried out to select data points on the signal foot portions and on the baseline. Step 3 is effected to find the angle $\phi_c$ from the selected data points and to make corrections.

In the first step 1, the outer product of a vector directed from a data point (i−1) to i in a complex space and another vector directed from the data point i to (i+1) is taken into consideration. The data points are so selected that the outer product assumes a positive value. In a portion where signal components prevail, the contribution of noise is small and so the outer product is negative. On the other hand, on signal foot portions and on the baseline, noise dominates. Therefore, the outer product is either positive or negative. Accordingly, if such data points are selected that the outer product is made positive, then it follows that data points on the signal foot portions and on the baseline are selected.

In the case of data about a multi-dimensional NMR spectrum, a plurality of slice data sets existing in the direction of the directly observed axis along which signals are distributed are extracted and linked together, thus creating a virtual one-dimensional spectral data. Then, with respect to this 1D spectral data, data selection is done, utilizing the above-described outer product.

In the decision (step 1) made, based on the outer product, data points where one peak overlaps another peak might be extracted. These data points act as noises in the operation of step 3. Therefore, in step 2, only those data points which certainly form the signal foot portions and baseline are selected. More specifically, with respect to the data points selected in step 1, the average AV of the lengths of vectors from data point (i−1) to i and their standard deviation SD are found. Then, only those data points i's which make vectors from the data point (i−1) to i and vectors from i to (i+1) shorter than (AV+3 SD) are selected. These steps are repeated until any data point can no longer be discarded.

Figure 7A:
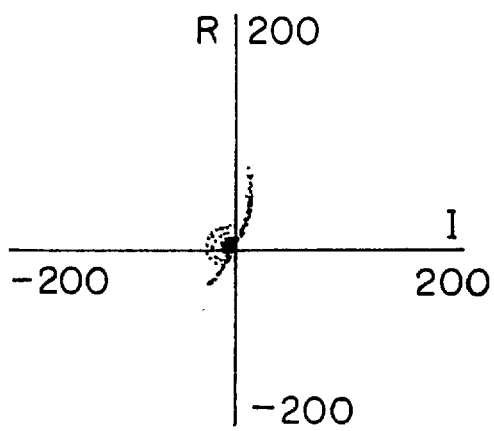
FIGS. 7(a)–7(d) are diagrams illustrating a process for selecting data about signal feet and data about the baseline.
Figure 7B:
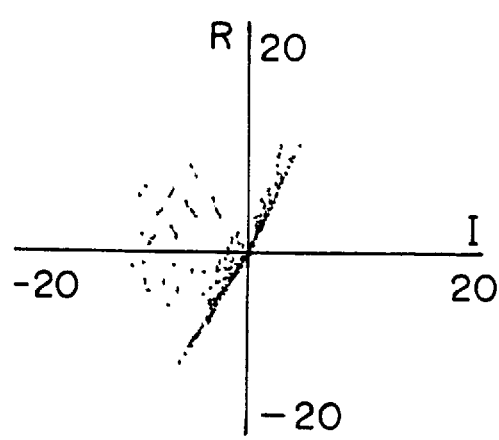
Figure 7C:
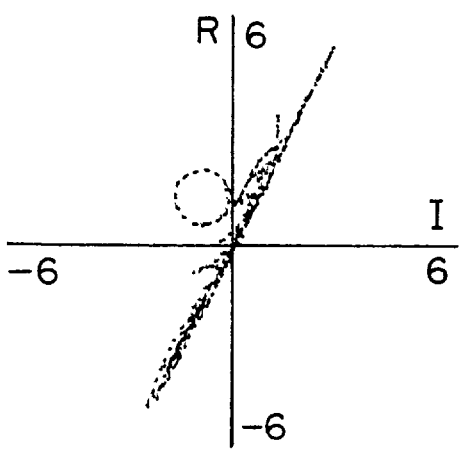
Figure 7D:
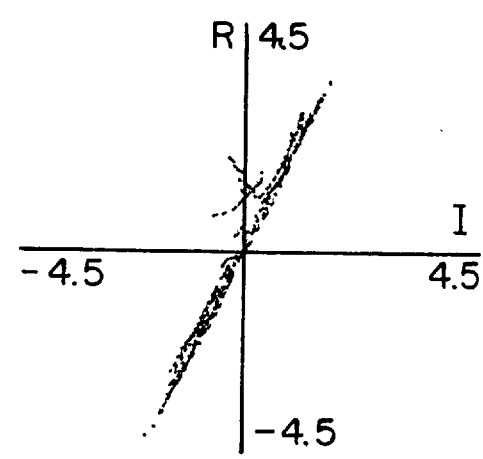

FIGS. 7(a)–7(d) illustrate the process for selecting data points in steps 1 and 2. In FIG. 7(a), all 32,768 points about the original data prior to execution of step 1 are plotted on the i-r plane. In FIG. 7(b), 5,435 points left after step 1 are plotted on the i-r plane. In FIG. 7(c), 4,661 points left when step 2 is being carried out are plotted on the i-r plane. In FIG. 7(d), 4,147 points left after step 2 are plotted on the i-r plane.

Those data points which certainly form the signal foot portions and baseline are selected by the above-described steps 1 and 2. In the final step 3, the angle $\phi_c$ is determined, using the data points selected by the steps 1 and 2, by a computer. The spectrum is corrected according to Eq. (19), using the obtained angle $\phi_c$, by the computer. The angle $\phi_c$ can be determined by principle component analysis or other methods.

Figure 8A:
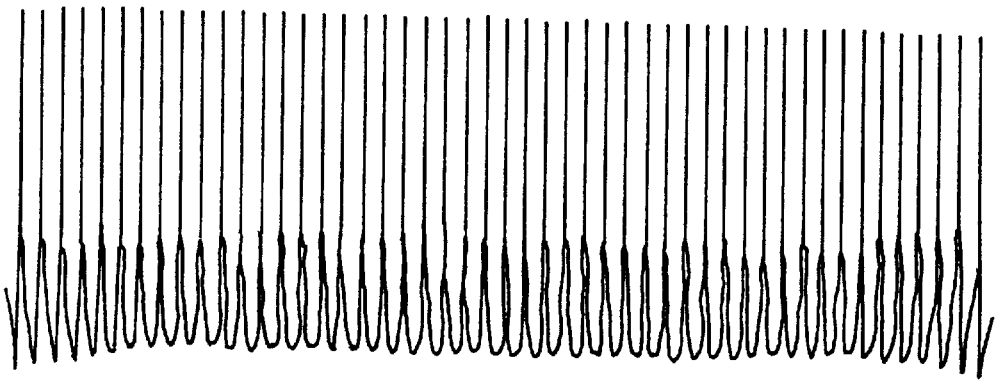
FIG. 8(a) is a diagram showing an NMR spectrum obtained when phase corrections are made by giving coefficients manually.
Figure 8B:
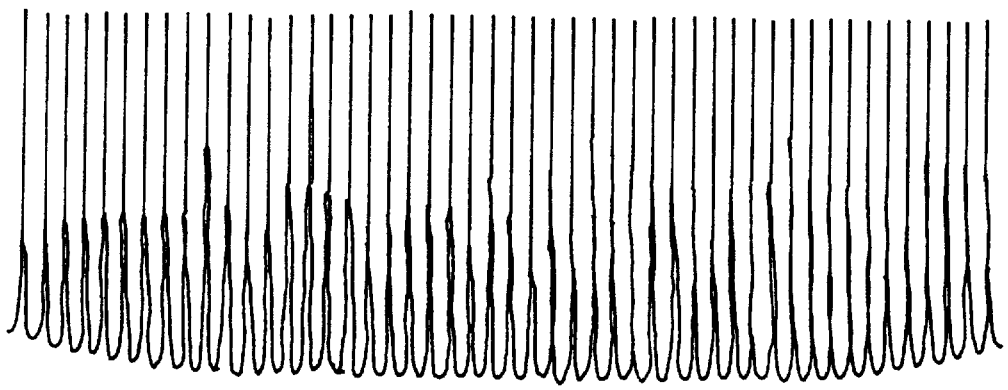
FIG. 8(b) is a diagram showing an NMR spectrum obtained when phase corrections are automatically made according to the invention.

FIG. 8(a) illustrates a case in which a human analyzer manually gives zeroth- and first-order coefficients to the instrument in making phase corrections. FIG. 8(b) illustrates an NMR spectrum whose phases have been automatically corrected according to the invention. These spectra are obtained by accumulating spectra arising from water while shifting the frequencies of the carrier wave and of the detected reference wave. In the prior art technique illustrated in FIG. 8(a), the coefficients are given, paying attention to vicinities of the center of the spectrum. Consequently, it is observed that phase shifts at both ends of the spectrum remain uncorrected considerably. In the spectrum of FIG. 8(b) obtained by the novel automatic phase correction method, the phases have been precisely corrected over the whole range of the spectrum.

Figure 9A:
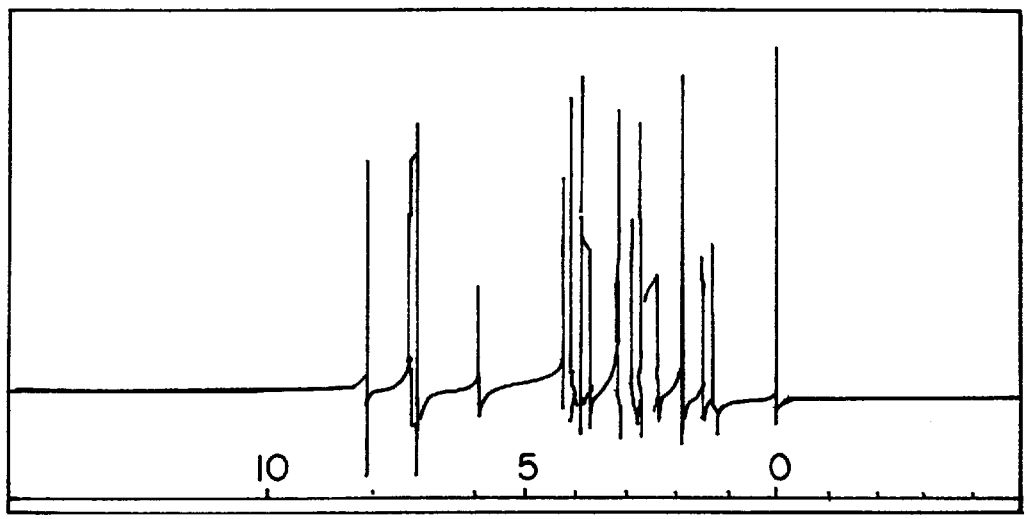
FIG. 9(a) is a $^1$H-NMR spectrum obtained from strychnine.
Figure 9B:
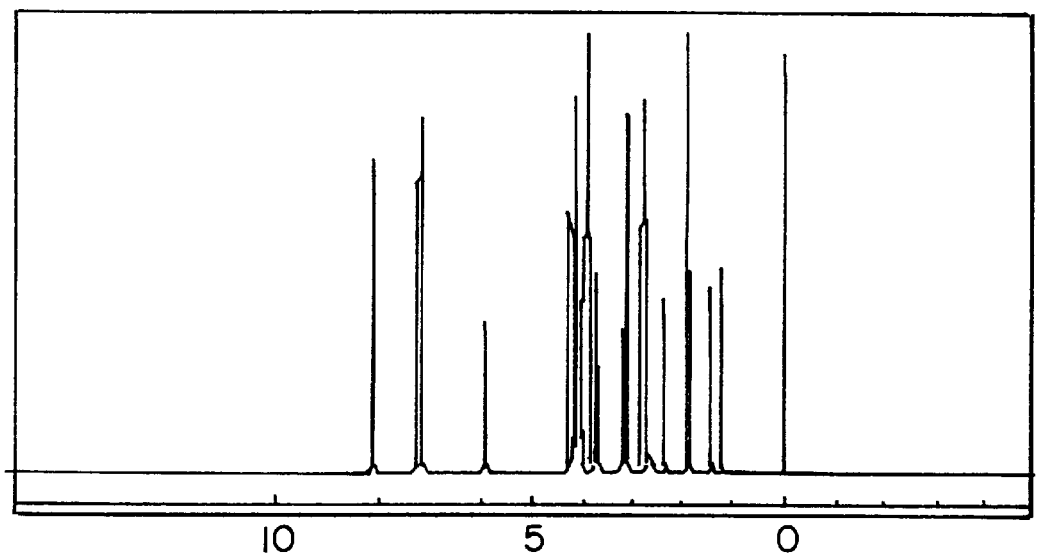
FIG. 9(b) is a $^1$H-NMR spectrum similar to FIG. 9(a), but in which phases have been automatically corrected according to the invention.

FIG. 9(a) shows a one-dimensional $^1$H-NMR spectrum of strychnine. FIG. 9(b) shows a spectrum obtained by making an automatic phase correction to the spectrum shown in FIG. 9(a) according to the invention.

Figure 10A:
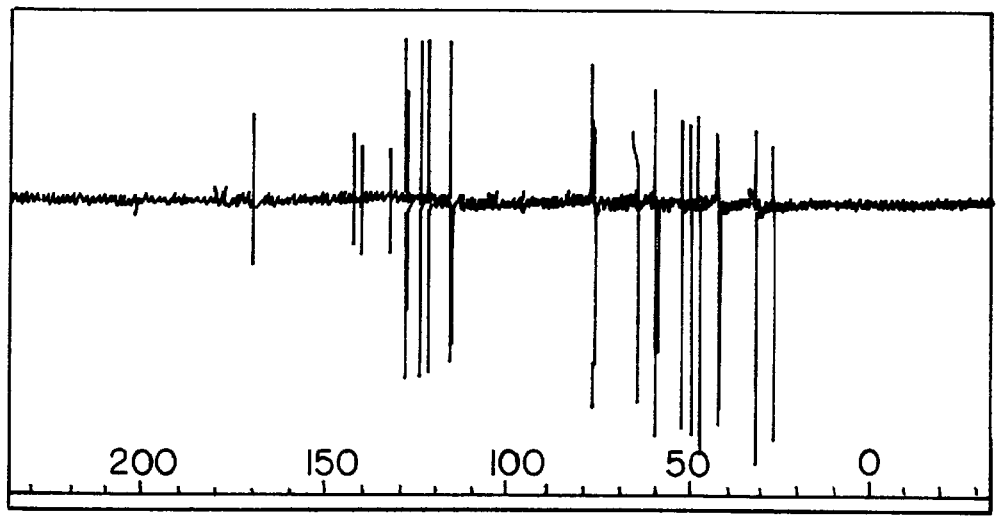
FIG. 10(a) is a $^{13}$C-NMR spectrum obtained from strychnine.
Figure 10B:
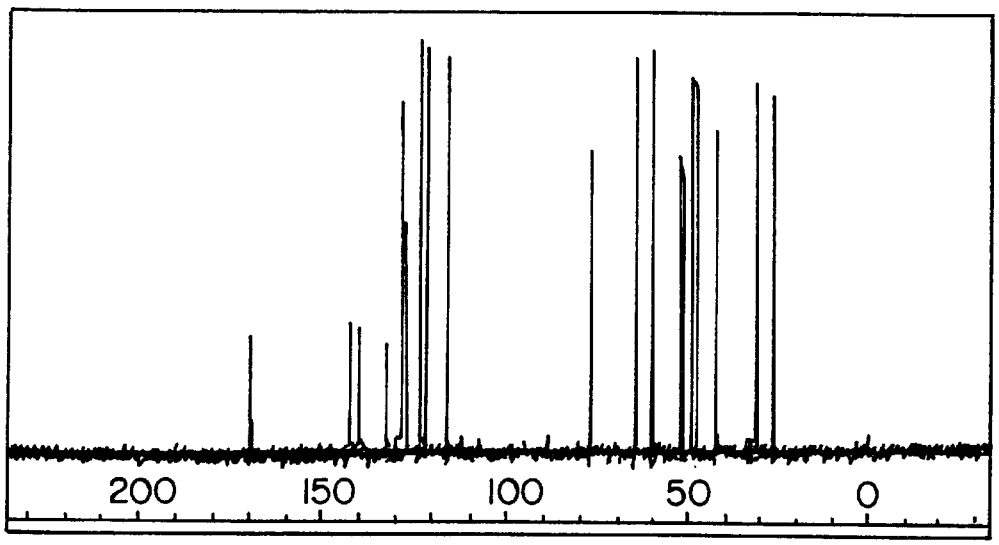
FIG. 10(b) is a $^{13}$C-NMR spectrum similar to FIG. 10(a), but in which phases have been automatically corrected according to the invention.

FIG. 10(a) shows a one-dimensional $^{13}$C-NMR spectrum of the same sample. FIG. 10(b) shows a spectrum obtained by making an automatic phase correction to the spectrum shown in FIG. 10(a) according to the invention.

Figure 11A:
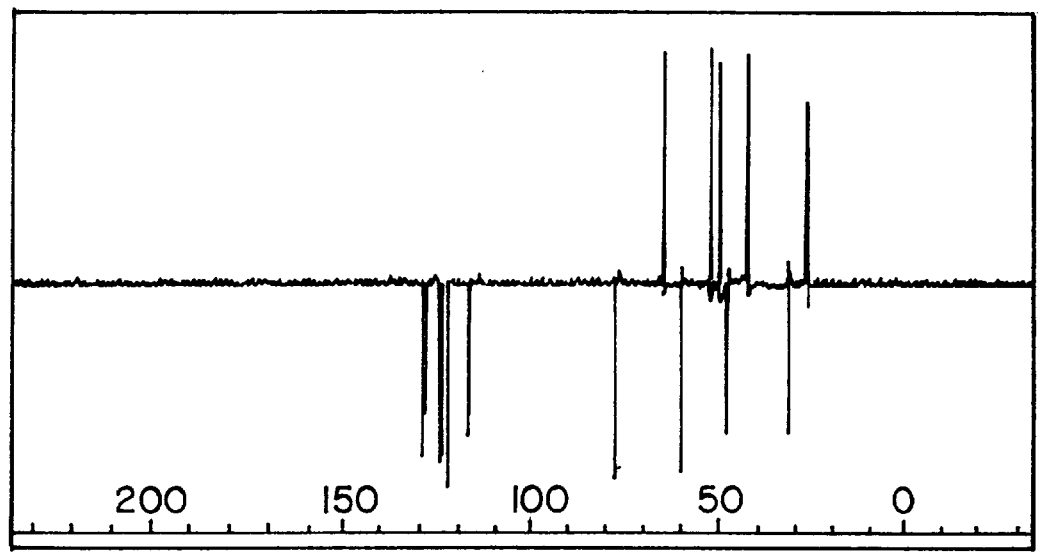
FIG. 11(a) is a $^{13}$C-NMR spectrum obtained by a DEPT 135 experiment of strychnine.
Figure 11B:
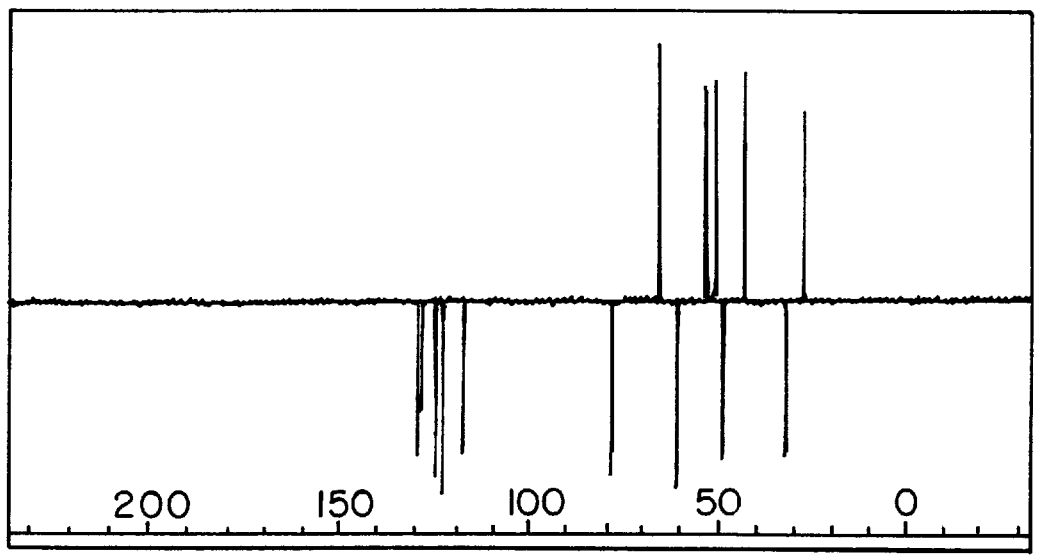
FIG. 11(b) is a $^{13}$C-NMR spectrum similar to FIG. 11(a), but in which phases have been automatically corrected according to the invention.

FIG. 11(a) shows a DEPT 135 spectrum of the same sample. FIG. 11(b) shows a spectrum obtained by making an automatic phase correction to the spectrum shown in FIG. 11(a) according to the invention.

All of FIGS. 9(a)–11(b) show that phase corrections are correctly made over the whole region of a one-dimensional spectrum.

Figure 12A:
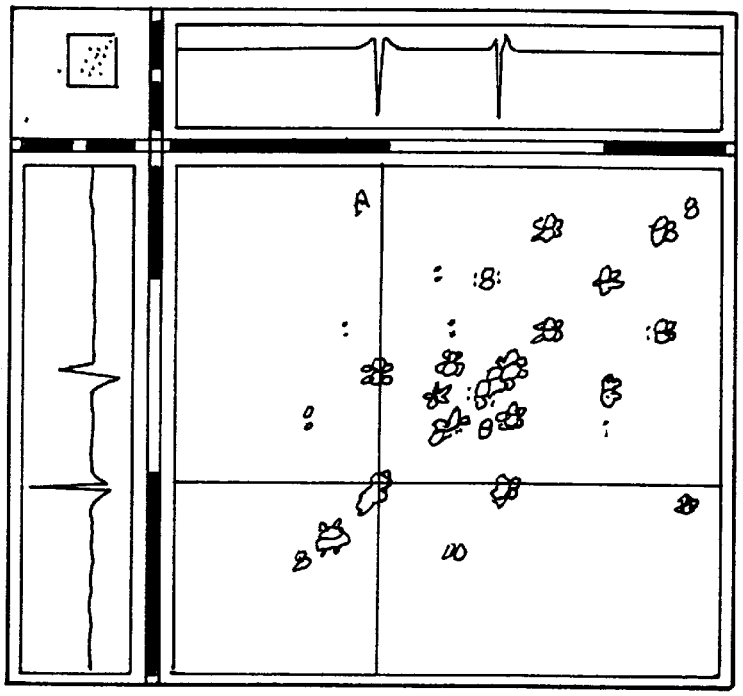
FIG. 12(a) is a DQF-COSY spectrum obtained by a 2D NMR measurement of strychnine.
Figure 12B:
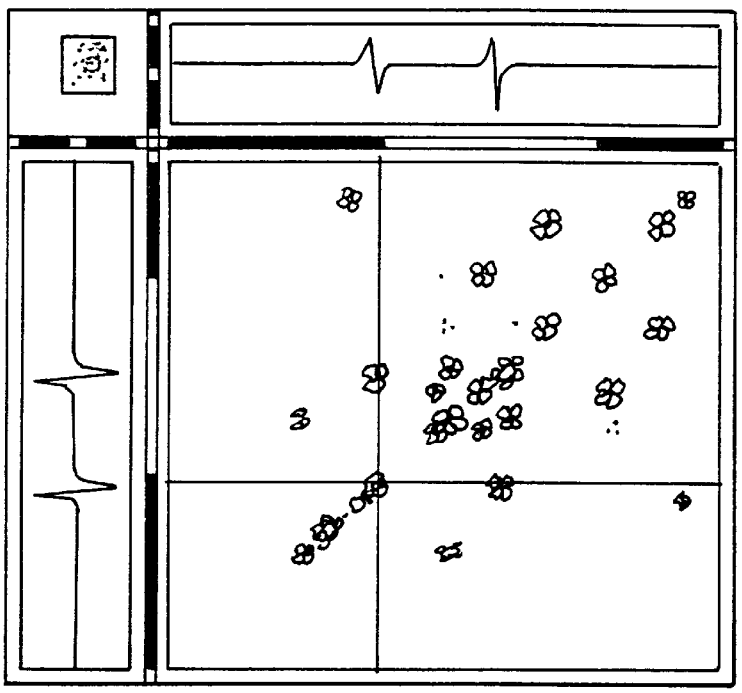
FIG. 12(b) is a DQF-COSY spectrum similar to FIG. 12(a), but in which phases have been automatically corrected according to the invention.

FIG. 12(a) shows a DQF-COSY spectrum of strychnine obtained by a two-dimensional NMR measurement. FIG. 12(b) shows a similar spectrum, but in which phases have been automatically corrected according to the invention.

Figure 13A:
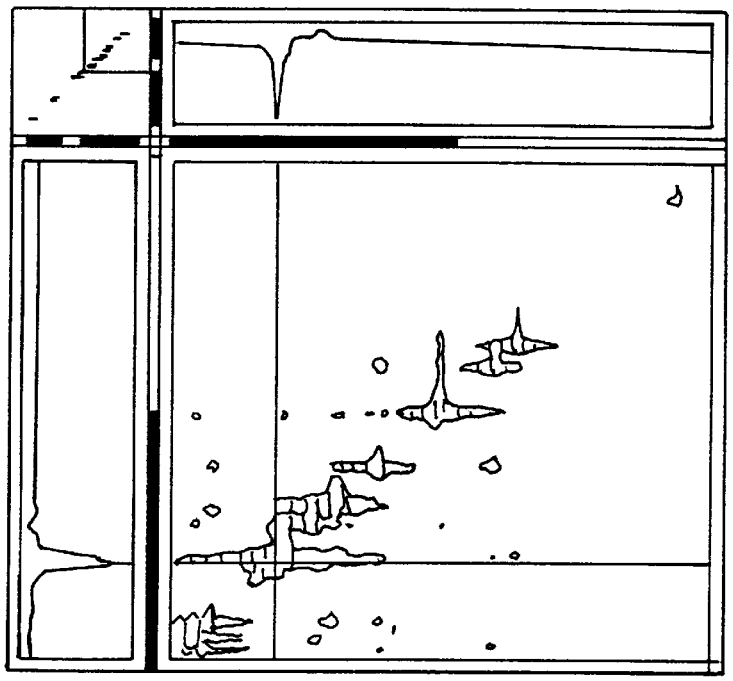
FIG. 13(a) is a NOESY spectrum obtained by a 2D NMR measurement of strychnine.
Figure 13B:
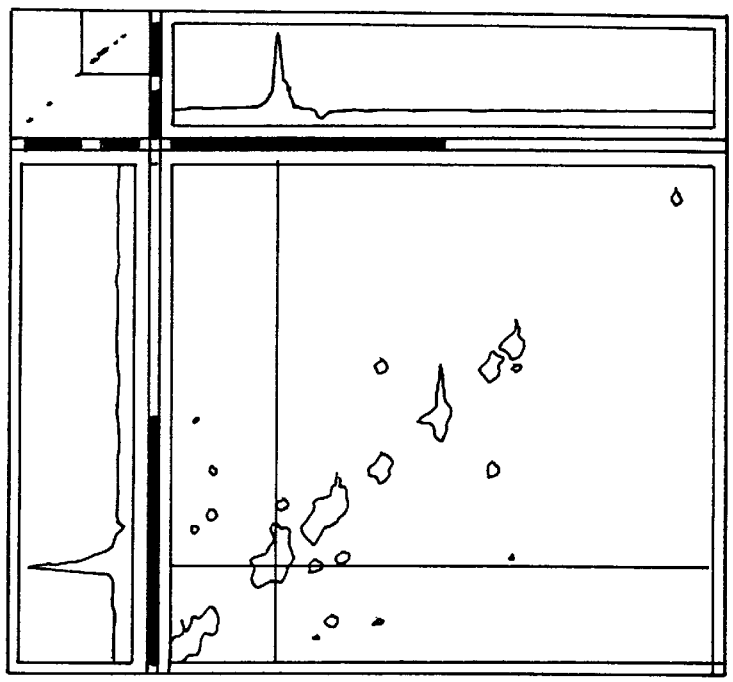
FIG. 13(b) is a NOESY spectrum similar to FIG. 13(a), but in which phases have been automatically corrected according to the invention.

FIG. 13(a) shows a NOESY spectrum of the same sample obtained by a two-dimensional NMR measurement. FIG. 13(b) shows a similar spectrum, but in which phases have been automatically corrected according to the invention.

Figure 14A:
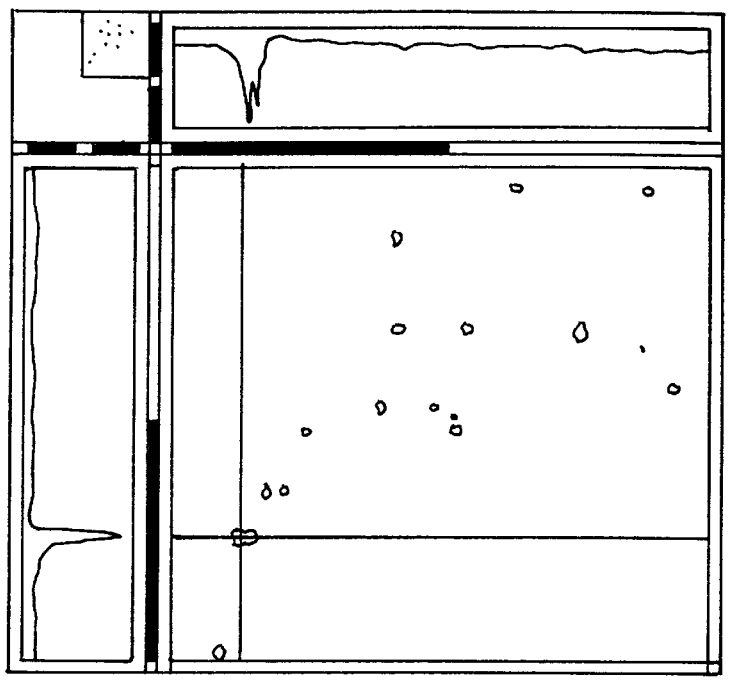
FIG. 14(a) is a HSQC spectrum obtained by a 2D NMR measurement of strychnine.
Figure 14B:
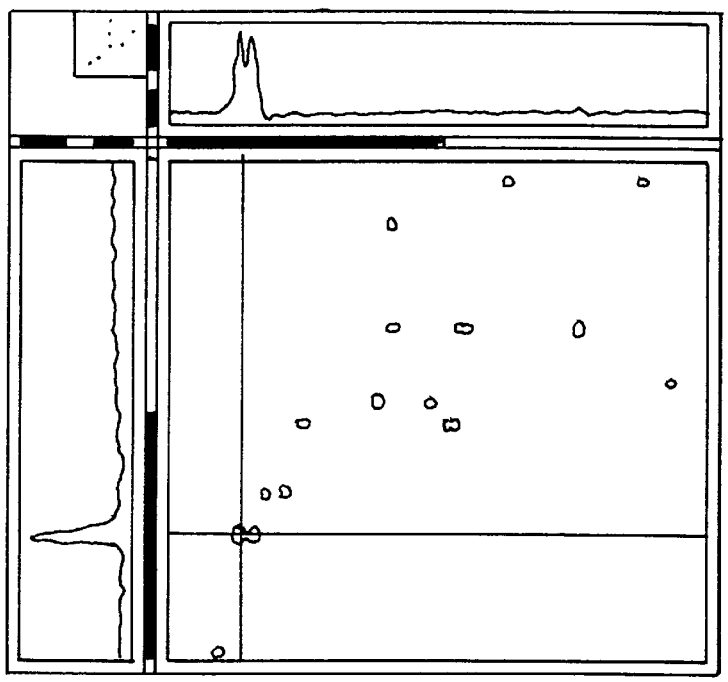
FIG. 14(b) is a HSQC spectrum similar to FIG. 14(a), but in which phases have been automatically corrected according to the invention.

FIG. 14(a) shows an HSQC spectrum of the same sample obtained by a two-dimensional NMR measurement. FIG. 14(b) shows a similar spectrum, but in which phases have been automatically corrected according to the invention.

All of FIGS. 12(a)–14(b) show that phase corrections have been precisely made over the whole region on both $F_2$- and $F_1$-axes.

It is to be understood that the present invention is not limited to the above embodiments and that various changes and modifications are possible within the spirit of the invention. For example, corrections of phase shifts due to measurement delay, corrections of phase shifts due to the frequency filter, and corrections of phase shifts due to off-resonance effects may be made in any desired order. Furthermore, the corrections may be first made only on the directly observed axis and then on the indirectly observed axis.

Where phase shifts caused the phase difference between the detected reference wave and the carrier wave are corrected, the following method may also be employed to extract data points in the signal foot portions and on the baseline. The average value ($y^-$) of intensities and the standard deviation ($\sigma$) are calculated. Data points deviating from $y^-+3\sigma$ are removed. With respect to the remaining data points, the average value ($y^-$) and the standard deviation ($\sigma$) are calculated. Again, data points deviating from $y^-+3\sigma$ are removed. These operations are repeated until the amount of data points removed becomes zero or infinitesimal. Finally, it is determined that the remaining data points are data points in the signal foot portions and on the baseline.

As can be understood from the description provided thus far, in the present invention, phase shifts due to measurement delay, phase shifts due to a frequency filter, and phase shifts due to off-resonance effects are corrected. Then, the constant terms of the phase shifts are corrected. As a consequence, a complete absorption, two- or higher dimensional NMR spectrum can be automatically obtained. Furthermore, phase corrections can be well made up to the edges of the spectrum since higher-order polynomials can be used for frequencies.

Having thus described my invention with the detail and particularity required by the Patent Laws, what is desired protected by Letters Patent is set forth in the following claims.

What is claimed is:

1. A method of automatically correcting phase shifts contained in a nuclear magnetic resonance (NMR) spectrum, said method comprising the steps of:

obtaining data $S(\omega)$ about an NMR spectrum of a specimen, by nuclear magnetic resonance measurements, wherein frequency $\omega$ is a variable;

correcting said data $S(\omega)$ about phase shifts $\phi_d$ due to delay of the measurements, phase shifts $\phi_f$ due to a frequency filter, and phase shifts $\phi_o$ due to off-resonance effects; and correcting the corrected data about phase shifts $\phi_c$ due to a phase difference between an RF carrier and a reference in said NMR measurements.

2. The method of claim 1, wherein (A) said data $S(\omega)$ about an NMR spectrum of the specimen is data about a multi-dimensional NMR spectrum having a directly observed axis and an indirectly observed axis;

(B) said corrections of the data about the phase shifts $\phi_d$ due to the delay of the measurements and said corrections of the data about phase shifts $\phi_o$ due to off-resonance effects are made on both directly observed axis and indirectly observed axis; and (C) said corrections of the data about the phase shifts $\phi_f$ due to the frequency filter and said corrections of the data about the phase shifts $\phi_c$ due to said phase difference are made only on said directly observed axis.

3. The method of claim 1 or 2, wherein said corrections of the data for the phase shifts $\phi_d$ due to the delay of the measurements are made by performing a calculation given by $$S(\omega)\{ \cos (\omega t_d) - i \sin (\omega t_d)\}$$

using a delay time $t_d$ given according to a pulse sequence used for the measurements.

4. The method of claim 1 or 2, wherein said corrections of the data for the phase shifts $\phi_f$ due to the frequency filter are made by calculating the phase shifts $\phi_f$ according to a calculation formula about the frequency filter used for the measurements within a range of observed frequencies and performing a calculation given by $$S(\omega) [ \cos \{\phi_f(\omega)\} - i \sin \{\phi_f(\omega)\}]$$

using the calculated phase shifts $\phi_f$.

5. The method of claim 1 or 2, wherein said corrections of the data for the phase shifts $\phi_o$ due to off-resonance effects are made by using phase shifts $\phi_o$ calculated from pulse width and effective pulse width used for the measurements and performing a calculation given by $$S(\omega) [ \cos \{\phi_o(\omega)\} - i \sin \{\phi_o(\omega)\}].$$

6. The method of claim 1 or 2, wherein said corrections of the data for the phase shifts $\phi_c$ due to the phase difference between said RF carrier and said reference are made by selecting data about foot portions and data about a baseline of an NMR signal from said data $S(\omega)$ about the NMR spectrum, finding direction of dispersion of the data from the selected data to determine the phase shifts $\phi_c$, and performing a calculation given by $$S(\omega) \{ \cos (\phi_c) - i \sin (\phi_c) \}$$

using the determined phase shifts $\phi_c$.

7. The method of claim 6, wherein said step of selecting data about foot portions and data about a baseline of an NMR signal from said data $S(\omega)$ about the NMR spectrum consists of selecting arbitrary data points i's so that outer product of a vector from data point (i−1) to i and a vector from data point i to (i+1) assumes a positive value.

8. An apparatus for automatically correcting a nuclear magnetic resonance (NMR) spectrum for phase shifts contained in said spectrum, said apparatus comprising:

means for making nuclear magnetic resonance measurements, using an RF carrier and a reference signal, to obtain data $S(\omega)$ about an NMR spectrum of a specimen, said NMR spectrum containing a frequency $\omega$ as a variable;

a first phase correction means for correcting said data $S(\omega)$ for phase shifts $\phi_d$ due to delay of the measurements, phase shifts $\phi_f$ due to a frequency filter, and phase shifts $\phi_o$ due to off-resonance effects; and a second phase correction means for correcting the corrected data for phase shifts $\phi_c$ due to a phase difference between said RF carrier and said reference signal.

9. The apparatus of claim 8, wherein (A) said data $S(\omega)$ about an NMR spectrum of the specimen is data about a multi-dimensional NMR spectrum having a directly observed axis and an indirectly observed axis;

(B) said corrections of the data for the phase shifts $\phi_d$ due to the delay of the measurements and said corrections of the data for phase shifts $\phi_o$ due to off-resonance effects are made on both directly observed axis and indirectly observed axis; and (C) said corrections of the data for the phase shifts $\phi_f$ due to the frequency filter and said corrections $\phi_f$ the data for the phase shifts $\phi_c$ due to said phase difference are made only on said directly observed axis.

10. The apparatus of claim 8 or 9, wherein said corrections of the data for the phase shifts $\phi_d$ due to the delay of the measurements are made by performing a calculation given by $$S(\omega) \{ \cos (\omega t_d) - i \sin (\omega t_d) \}$$

using a delay time $t_d$ given according to a pulse sequence used for the measurements.

11. The apparatus of claim 8 or 9, wherein said corrections of the data for the phase shifts $\phi_f$ due to the frequency filter are made by said first phase correction means by calculating the phase shifts $\phi_f$ according to a calculational formula for the frequency filter used for the measurements within a range of observed frequencies and performing a calculation given by $$S(\omega)[ \cos \{\phi_f(\omega)\} - i \sin \{\phi_f(\omega)\} ]$$

using the calculated phase shifts $\phi_f$.

12. The apparatus of claim 8 or 9, wherein said corrections of the data for the phase shifts $\phi_o$ due to off-resonance effects are made by said first phase correction means by using phase shifts $\phi_o$ calculated from pulse width and effective pulse width used for the measurements and performing a calculation given by $$S(\omega) [ \cos \{\phi_o(\omega)\} - i \sin \{\phi_o(\omega)\} ].$$

13. The apparatus of claim 8 or 9, wherein said corrections of the data for the phase shifts $\phi_c$ due to the phase difference between said RF carrier and said reference signal is made by said second phase correction means by selecting data about foot portions and data about a baseline of an NMR signal from said data $S(\omega)$ about the NMR spectrum, finding direction of dispersion of the data from the selected data to determine the phase shifts $\phi_c$, and performing a calculation given by $$S(\omega) [ \cos \{\phi_c(\omega)\} - i \sin \{\phi_c(\omega)\} ]$$

using the determined phase shifts $\phi_c$.

* * * * *

UNITED STATES PATENT AND TRADEMARK OFFICE
CERTIFICATE OF CORRECTION

PATENT NO. : 5,838,156
DATED : November 17, 1998
INVENTOR(S) : Nobuyoshi Miyabayashi It is certified that error appears in the above-identified patent and that said Letters Patent is hereby corrected as shown below:

Column 4 Line 8, formula 6, last parenthesis:
"($°cF1$)" should read --($°F1$)--.

Column 4 Line 57 "135" should read --135-- (delete bold).

Column 6 Line 58 "$\Omega_k$ and $\Omega_k$" should read --$\Omega_k$ and $Q_k$--.

Column 9 Line 14, at end of paragraph, insert period --.--.

Column 9 Line 45 delete "w" and insert --$\omega$--.

Column 9 Line 50 "t-axis" should read --$\omega$-axis--.

Column 13 Line 45 Claim 9 "$\phi_f$ the data" should read --of the data--.

Signed and Sealed this

Twenty-second Day of June, 1999

Attest:

Q. TODD DICKINSON

*Attesting Officer*   Acting Commissioner of Patents and Trademarks